(12) United States Patent
Brooks, Jr. et al.

(10) Patent No.: US 11,579,584 B2
(45) Date of Patent: Feb. 14, 2023

(54) APPARATUS AND METHOD FOR CONTOURED-SURFACE COMPONENT REPAIR

(71) Applicant: The Boeing Company, Chicago, IL (US)

(72) Inventors: Christopher Brooks, Jr., Mount Pleasant, SC (US); Phillip Crothers, Hampton (AU)

(73) Assignee: The Boeing Company, Arlington, VA (US)

( * ) Notice: Subject to any disclaimer, the term of this patent is extended or adjusted under 35 U.S.C. 154(b) by 622 days.

(21) Appl. No.: 16/595,161

(22) Filed: Oct. 7, 2019

(65) Prior Publication Data

US 2021/0103266 A1    Apr. 8, 2021

(51) Int. Cl.
  *G05B 19/402*    (2006.01)
  *G05B 23/02*    (2006.01)
  *G06F 30/15*    (2020.01)

(52) U.S. Cl.
  CPC ....... *G05B 19/402* (2013.01); *G05B 23/0283* (2013.01); *G05B 23/0294* (2013.01); *G06F 30/15* (2020.01); *G05B 2219/35134* (2013.01)

(58) Field of Classification Search
  None
  See application file for complete search history.

(56) References Cited

U.S. PATENT DOCUMENTS

| | | | |
|---|---|---|---|
| 2012/0316666 A1* | 12/2012 | Boyl-Davis | G05B 19/40931 700/98 |
| 2013/0108803 A1* | 5/2013 | Matos | C23C 14/46 118/723 R |
| 2015/0039123 A1* | 2/2015 | Lindgren | B29C 73/10 700/191 |
| 2015/0094836 A1* | 4/2015 | Rivers | B23Q 17/22 700/160 |
| 2016/0284457 A1* | 9/2016 | Wilson | B25J 15/00 |
| 2017/0160724 A1* | 6/2017 | Kikata | B23Q 1/0045 |
| 2019/0275695 A1* | 9/2019 | Grove | B23Q 3/18 |
| 2020/0306918 A1* | 10/2020 | Llamas | B24B 29/005 |

* cited by examiner

*Primary Examiner* — Bernard G Lindsay
(74) *Attorney, Agent, or Firm* — Kunzler Bean & Adamson

(57) ABSTRACT

Disclosed herein is a method of repairing a component. The method includes scanning a damaged area of the component, and preparing a repair plan in response to the scanning. The method may also include providing the repair plan to a guided tool having a position correcting controller, and removing damaged material from the component in preparation for a repair operation. An apparatus is also disclosed that includes a computing device configured for performing actions. The computing device includes a processor and a local memory. The actions include detecting damage to the component, recording position information of the detected damage, and incorporating the position information in the repair plan.

20 Claims, 13 Drawing Sheets

APPARATUS AND METHOD FOR CONTOURED-SURFACE COMPONENT REPAIR

FIELD

This disclosure relates generally to systems for repairing vehicle components, and more particularly to repairing vehicle components using a guided tool having a position correction system.

BACKGROUND

Vehicles, including air-borne vehicles, are frequently assembled by aligning different parts/panels on structures, potentially with other components. The parts, panels, or components may require an in-place repair. One method of repair includes using a hand-guided cutting tool to remove an area of a component and then patching the area. However, hand-guided tools are known to be imprecise and labor-intensive.

SUMMARY

The subject matter of the present application provides an example apparatus and methods that overcome the above-discussed shortcomings of prior art techniques. The subject matter of the present application has been developed in response to the present state of the art, and in particular, in response to shortcomings of current cutting tools, and the conventional methods and systems for repairing component damage to vehicles, including airplanes.

Disclosed herein is a method of repairing a component. The method includes scanning a damaged area of the component, and preparing a repair plan in response to the scanning. The method may also include providing the repair plan to a guided tool having a position correcting controller, and removing damaged material from the component in preparation for a repair operation. The preceding subject matter of this paragraph characterizes example 1 of the present disclosure.

The method also includes scanning a damaged area of the component further comprises scanning a non-planar surface of the component, and creating a flattening shim based on the scanning. The preceding subject matter of this paragraph characterizes example 2 of the present disclosure, wherein example 2 also includes the subject matter according to example 1, above.

The flattening shim comprises a non-planar first side that mates with the non-planar surface of the component. The preceding subject matter of this paragraph characterizes example 3 of the present disclosure, wherein example 3 also includes the subject matter according to examples 1 and 2, above.

The method also includes positioning the flattening shim on the component. The preceding subject matter of this paragraph characterizes example 4 of the present disclosure, wherein example 4 also includes the subject matter according to examples 1-3, above.

The repair plan includes instructions for the position correcting controller to move a cutting tool, with reference to a platform, in three dimensions. The preceding subject matter of this paragraph characterizes example 5 of the present disclosure, wherein example 5 also includes the subject matter according to examples 1-4, above.

The instructions, in certain embodiments, cause the position correcting controller to adjust a cut depth in the component. The preceding subject matter of this paragraph characterizes example 6 of the present disclosure, wherein example 6 also includes the subject matter of example 5, above.

The method also includes generating a 2D representation of the component from a 3D computer-aided design (CAD) model, indicating a drilling hole pattern in the 2D representation, and importing the 2D representation into the guided tool. The preceding subject matter of this paragraph characterizes example 7 of the present disclosure, wherein example 7 also includes the subject matter according to examples 1-6, above.

The method also includes operatively coupling a non-destructive inspector to the position correcting controller. The preceding subject matter of this paragraph characterizes example 8 of the present disclosure, wherein example 8 also includes the subject matter according to examples 1-7, above.

The method also includes performing non-destructive inspection by guiding the guided tool across the surface of the component, and detecting damage to the component. In certain embodiments, the method also includes recording position information of the detected damage, and incorporating the position information in the repair plan. The preceding subject matter of this paragraph characterizes example 9 of the present disclosure, wherein example 9 also includes the subject matter according to example 8, above.

The method also includes providing a support surface plug and positioning the support surface plug within a void created by the guided tool to maintain the guided tool at a horizontal level. The preceding subject matter of this paragraph characterizes example 10 of the present disclosure, wherein example 10 also includes the subject matter according to any one of examples 1-9, above.

The method also includes providing a zero-gravity arm having a first end and a second end. The preceding subject matter of this paragraph characterizes example 11 of the present disclosure, wherein example 11 also includes the subject matter according to any one of the examples 1-10 above.

The method also includes coupling the first end to the guided tool and the second end to a support structure. The preceding subject matter of this paragraph characterizes example 12 of the present disclosure, wherein example 12 also includes the subject matter according to example 11, above.

The method also includes operatively coupling a plasma treatment device to the position correcting controller. The preceding subject matter of this paragraph characterizes example 13 of the present disclosure, wherein example 13 also includes the subject matter according to examples 1-12, above.

The method also includes providing a drill-bar position encoder, where the drill-bar position encoder includes a plurality of hole indicators and a plurality of position identifiers. The preceding subject matter of this paragraph characterizes example 14 of the present disclosure, wherein example 14 also includes the subject matter according to examples 1-13, above.

Additionally, disclosed herein is an apparatus comprising at least one computing device that is configured for performing actions, where the at least one computing device includes a processor and a local memory. The actions include detecting damage to the component, recording position information of the detected damage, and incorporating the position information in the repair plan. The preceding subject matter of this paragraph characterizes example 15 of the present disclosure.

The apparatus is also configured for performing actions that include scanning a non-planar surface of the component and creating a flattening shim based on the scanning. The preceding subject matter of this paragraph characterizes example 16 of the present disclosure, wherein example 16 also includes the subject matter according to example 15, above.

The apparatus is also configured for performing actions that include adjusting a cut depth of a cutting tool with reference to a platform. The preceding subject matter of this paragraph characterizes example 17 of the present disclosure, wherein example 17 also includes the subject matter according to examples 15 and 16, above.

The apparatus is also configured for performing actions that include generating a 2D representation of the component from a 3D computer-aided design (CAD) model, indicating a drill hole pattern in the 2D representation, and importing the 2D representation into the guided tool. The preceding subject matter of this paragraph characterizes example 18 of the present disclosure, wherein example 18 also includes the subject matter according to examples 15-17, above.

The apparatus is also configured for performing actions that include performing non-destructive inspection by guiding the guided tool across the surface of the component, and detecting damage to the component. The actions may also include recording position information of the detected damage, and incorporating the position information in the repair plan. The preceding subject matter of this paragraph characterizes example 19 of the present disclosure, wherein example 19 also includes the subject matter according to examples 15-18, above.

Additionally, disclosed herein is a computer program product for component repair, the computer program product comprising a computer readable storage medium having program instructions embodied therewith, the program instructions executable by a processor to cause the processor to perform actions. The actions may include scanning a damaged area of a component, and preparing a repair plan in response to the scanning. The actions also include providing the repair plan to a guided tool having a position correcting controller, and removing damaged material from the component in preparation for a repair operation. The preceding subject matter of this paragraph characterizes example 20 of the present disclosure.

The described features, structures, advantages, and/or characteristics of the subject matter of the present disclosure may be combined in any suitable manner in one or more examples, including embodiments and/or implementations. In the following description, numerous specific details are provided to impart a thorough understanding of examples of the subject matter of the present disclosure. One skilled in the relevant art will recognize that the subject matter of the present disclosure may be practiced without one or more of the specific features, details, components, materials, and/or methods of a particular example, embodiment, or implementation. In other instances, additional features and advantages may be recognized in certain examples, embodiments, and/or implementations that may not be present in all examples, embodiments, or implementations. Further, in some instances, well-known structures, materials, or operations are not shown or described in detail to avoid obscuring aspects of the subject matter of the present disclosure. The features and advantages of the subject matter of the present disclosure will become more fully apparent from the following description and appended claims, or may be learned by the practice of the subject matter as set forth hereinafter.

BRIEF DESCRIPTION OF THE DRAWINGS

In order that the advantages of the subject matter may be more readily understood, a more particular description of the subject matter briefly described above will be rendered by reference to specific examples that are illustrated in the appended drawings. Understanding that these drawings depict only typical examples of the subject matter, they are not therefore to be considered to be limiting of its scope. The subject matter will be described and explained with additional specificity and detail through the use of the drawings, in which.

DETAILED DESCRIPTION

Reference throughout this specification to "one example," "an example," or similar language means that a particular feature, structure, or characteristic described in connection with the example is included in at least one example of the present disclosure. Appearances of the phrases "in one example," "in an example," and similar language throughout this specification may, but do not necessarily, all refer to the same example. Similarly, the use of the term "implementation" means an implementation having a particular feature, structure, or characteristic described in connection with one or more examples of the present disclosure, however, absent an express correlation to indicate otherwise, an implementation may be associated with one or more examples.

Figure 1:
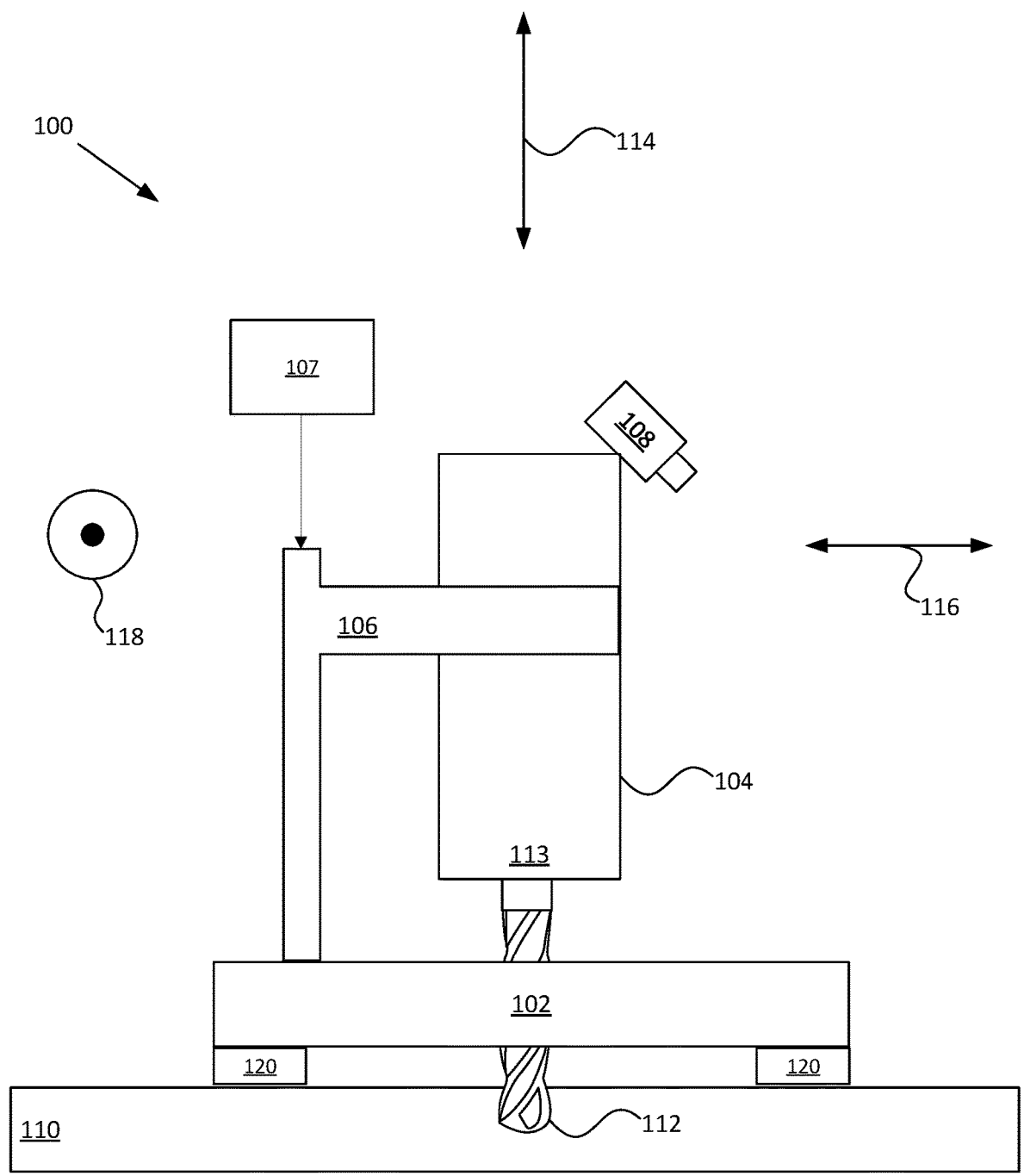
FIG. 1 is a schematic block diagram illustrating a guided tool for computer-aided repairs of contoured surfaces according to one or more examples of the present disclosure.

FIG. 1 is a schematic block diagram illustrating a guided tool 100 for computer-aided repairs of contoured surfaces according to one or more examples of the present disclosure. The guided tool 100, in one example, is a guided tool that aides a user in making precise routs in an object while being guided, relatively imprecisely, by the user. The guided tool 100 accomplishes this by monitoring the position of the guided tool 100 with reference to the object and adjusting a position of a cutting tool. The guided tool 100 is provided with a platform 102 upon which a cutting tool 104 is mounted. One or more moveable arms 106 couple the cutting tool 104 to the platform 102. The cutting tool 104, for example, may be a router that includes a router bit or a cutting bit 112 driven by a motor 113.

The one or more moveable arms 106 are controlled by a position correcting controller 107 (hereinafter "controller 107") that receives location information of the guided tool 100 with reference to a component 110. The location information may be determined by a camera 108 that views position indicators (see for example, FIG. 13) on a surface of the component 110, and adjusts the position of the cutting tool 104 with reference to the platform 102. The position indicators may be adhered to the surface of the component 110. Alternatives to the camera 108, for identifying a position, include, but are not limited to, infrared (IR) range finding, lasers, ultrasonic distance sensors, etc. As such, the guided tool 100 is capable of identifying the location of the guided tool 100 relative to the component 110 being repaired. The component 110, in some examples, is a sheet or panel that forms the body of a vehicle, for example, an aircraft, car, etc. The component 110 may become damaged and need repair. In the example of an aircraft, panels that form the exterior surface of the aircraft may require the replacement of rivets or other fasteners that attach the component 110 to a vehicle frame. The guided tool 100 is configured to precisely position the cutting tool 104 with reference to the platform 102 and the component 110 so that a rivet hole is drilled in a proper position.

The guided tool 100, as will be described in greater detail below, adjusts the position of the cutting tool 104 with reference to the platform 102 in response to a current location of the system on the component 110 and a desired cut or drill location that is defined by a repair plan. An example of a repair plan includes a computer numerical control (CNC) plan loaded into the controller 107 of the system. The repair plan may also be a 2D representation of a 3D CAD model. Stated differently, the repair plan includes instructions for the controller 107 to execute. As such, a user may slide the guided tool 100 imprecisely across the surface of the component 110 and the controller 107 makes adjustments to the position of the cutting tool 104 to precisely locate the cutting tool 104 according to the repair plan.

The guided tool 100 is configured to make position adjustments of the cutting tool 104 with reference to the platform 102, and may move the cutting tool 104 three-dimensionally, or stated differently, up and down (as indicated by arrow 114), left and right (as indicated by arrow 116), and into and out of the page (i.e., along a z-axis parallel to arrow 118) with reference to the platform 102. As a user moves the guided tool 100 over the surface of the component 110, the controller 107 commands the moveable arm 106 to adjust the position of the cutting tool 104 to compensate for the imprecise user movement. One or more platform feet 120 may be coupled to a bottom surface of the platform 102 to aide in sliding the platform 102 over the surface of the component 110.

Figure 2:
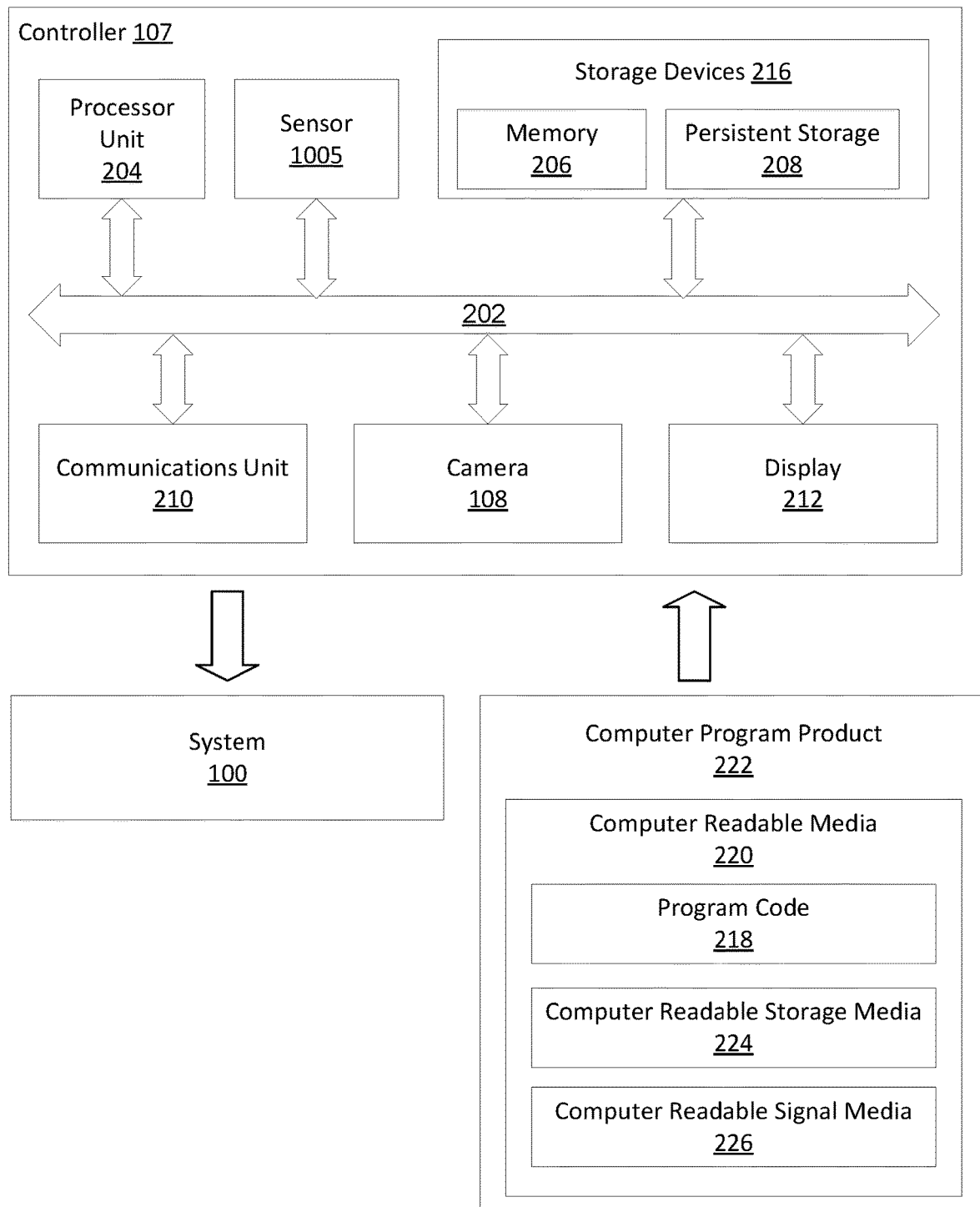
FIG. 2 is a schematic block diagram illustrating a controller in accordance with examples of the present disclosure.

FIG. 2 is a schematic block diagram illustrating a controller 107 in accordance with examples of the present disclosure. The controller 107 is an example of a computing device, which may be used to implement one or more components of examples of the disclosure, and in which computer usable program code or instructions implementing the processes may be located for the illustrative examples. In this illustrative example, the controller includes a communications fabric 202, which provides communications between a processor unit 204, sensors (e.g., positioning devices such as the camera 108), memory 206, persistent storage 208, communications unit 210, the camera 108, and display 212.

The processor unit 204 serves to execute instructions for software that may be loaded into memory 206. The processor unit 204 may be a set of one or more processors or may be a multi-processor core, depending on the particular implementation. Further, the processor unit 204 may be implemented using one or more heterogeneous processor systems, in which a main processor is present with secondary processors on a single chip. As another illustrative example, the processor unit 204 may be a symmetric multi-processor system containing multiple processors of the same type.

Memory 206 and persistent storage 208 are examples of storage devices 216. A storage device is any piece of hardware that is capable of storing information, such as, for example, without limitation, data, program code in functional form, and/or other suitable information either on a temporary basis and/or a permanent basis. Memory 206, in these examples, may be, for example, a random-access memory, or any other suitable volatile or non-volatile storage device. Persistent storage 208 may take various forms, depending on the particular implementation. For example, persistent storage 208 may contain one or more components or devices. For example, persistent storage 208 may be a hard drive, a flash memory, a rewritable optical disk, a rewritable magnetic tape, or some combination of the above. The media used by persistent storage 208 may be removable. For example, a removable hard drive may be used for persistent storage 208.

The communications unit 210, in these examples, provides for communication with other data processing systems or devices. In these examples, the communications unit 210 is a network interface card. The communications unit 210 may provide communications through the use of either, or both, physical and wireless communications links.

The camera 108 may be part of an input/output unit that allows for the input and output of data with other devices that may be connected to the controller 107. Alternatively, the camera 108 may communicate with the controller 107 via the communications unit 210. The input/output unit may also provide a connection for user input through a keyboard, a mouse, and/or some other suitable input device. Further, the input/output unit may send output to a printer or receive input from any other peripheral device. The display 212 provides a mechanism to display information to a user.

Instructions for the operating system, applications, and/or programs may be located in the storage devices 216, which are in communication with the processor unit 204 through the communications fabric 202. In these illustrative examples, the instructions are in a functional form on persistent storage 208. These instructions may be loaded into memory 206 for execution by the processor unit 204. The processes of the different examples may be performed by the processor unit 204 using computer implemented instructions, which may be located in a memory, such as the memory 206.

These instructions are referred to as program code, computer usable program code, or computer readable program code that may be read and executed by a processor in the processor unit 204. The program code, in the different examples, may be embodied on different physical or computer readable storage media, such as the memory 206 or the persistent storage 208.

Program code 218 is located in a functional form on computer readable media 220 that is selectively removable and may be loaded onto or transferred to the controller 107 for execution by the processor unit 204. The program code may also contain the repair plan discussed above with reference to FIG. 1. The program code 218 and computer readable media 220 form computer program product 222. In one example, the computer readable media 220 may be a computer readable storage media 224 or a computer readable signal media 226. The computer readable storage media 224 may include, for example, an optical or magnetic disc that is inserted or placed into a drive or other device that is part of the persistent storage 208 for transfer onto a storage device, such as a hard drive, that is part of the persistent storage 208. The computer readable storage media 224 also may take the form of a persistent storage, such as a hard drive, a thumb drive, or a flash memory that is connected to the controller 107. In some instances, the computer readable storage media 224 may not be removable from the controller 107.

Alternatively, the program code 218 may be transferred to the controller 107 using computer readable signal media 226. Computer readable signal media 226 may be, for example, a propagated data signal containing program code 218. For example, the computer readable signal media 226 may be an electromagnetic signal, an optical signal, and/or any other suitable type of signal. These signals may be transmitted over communications links, such as wireless communication links, an optical fiber cable, a coaxial cable, a wire, and/or any other suitable type of communications link. In other words, the communications link and/or the connection may be physical or wireless in the illustrative examples. The computer readable media also may take the form of non-tangible media, such as communications links or wireless transmissions containing the program code.

In some illustrative examples, the program code 218 may be downloaded over a network to the persistent storage 208 from another device or data processing system through the computer readable signal media 226 for use within the controller 107. For instance, program code stored in a computer readable storage media in a server data processing system may be downloaded over a network from a server to the controller 107. The system providing the program code 218 may be a server computer, a client computer, or some other device capable of storing and transmitting program code 218.

The different components illustrated for the controller 107 are not meant to provide physical or architectural limitations to the manner in which different examples may be implemented. The different illustrative examples may be implemented in a controller including components in addition to and/or in place of those illustrated for the controller 107. Other components shown in FIG. 2 can be varied from the illustrative examples shown. The different examples may be implemented using any hardware device or system capable of executing program code. For example, a storage device in the controller 107 is any hardware apparatus that may store data. The memory 206, persistent storage 208, and the computer readable media 220 are examples of storage devices in a tangible form.

In another example, a bus system may be used to implement communications fabric 202 and may be comprised of one or more buses, such as a system bus or an input/output bus. Of course, the bus system may be implemented using any suitable type of architecture that provides for a transfer of data between different components or devices attached to the bus system. Additionally, a communications unit may include one or more devices used to transmit and receive data, such as a modem or a network adapter. Further, a memory may be, for example, the memory 206 or a cache such as found in an interface and memory controller hub that may be present in the communications fabric 202.

Computer program code for carrying out operations for aspects of the present invention may be written in any combination of one or more programming languages, including an object-oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The controller 107 is configured to communicate with and control the guided tool 100. The controller 107 is configured to receive the repair plan and translate the repair plan into commands to alter the position of the cutting tool 104 with reference to the platform 102 based on a position of the platform 102 with reference to the component 110. The commands may include instructions to move the cutting tool 104 in any of the three-dimensional directions described above with reference to FIG. 1. Traditionally, hand-guided computer-aided positioning systems did not include vertical adjustments (i.e., cutting bit 112 depth) instructions. Beneficially, the guided tool 100 is configured to adjust the cutting bit 112 depth according to the repair plan. For example, the guided tool 100 is capable of performing a scarf repair that cuts a bowl-shaped depression of varying depth in the surface of the component 110 (see FIG. 7).

Figure 3A:
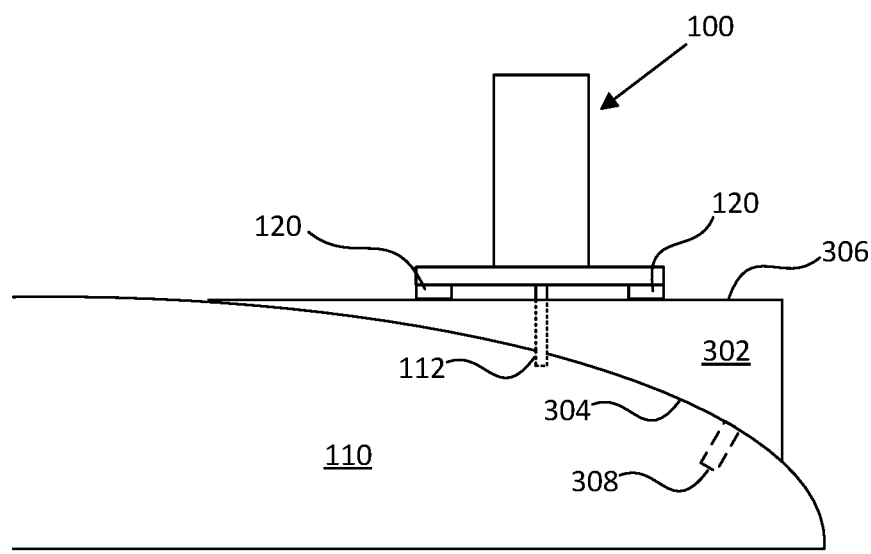
FIGS. 3a and 3b are schematic block diagrams of flattening shims in accordance with examples of the present disclosure.
Figure 3B:
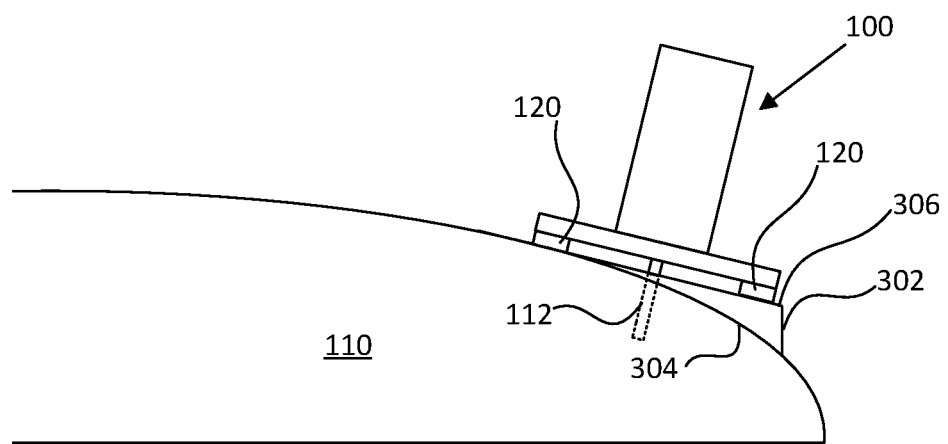

FIGS. 3a and 3b are schematic block diagrams of flattening shims 302 in accordance with examples of the present disclosure. A flattening shim 302 is a positionable member for providing a substantially planar working surface for the guided tool 100. A first side 304, or surface, of the flattening shim 302 is shaped to mate with a non-planar surface of the component 110. A second side 306, or surface, of the flattening shim 302 is formed with a substantially planar surface for engaging a platform foot 120, or multiple platform feet 120, of the guided tool 100. The flattening shim 302 may include a positioning member 308 extending outward from the first side 304 and configured to engage an opening in the surface of the component 110. The positioning member 308 maintains the position of the flattening shim 302 during a repair operation.

FIGS. 3a and 3b depict a portion of the component 110 that has a curved surface. One example of a curved component 110 is the wing of an aircraft. Alternatively, the flattening shim 302 may be utilized with any non-planar surface. The flattening shim 302 may be shaped to provide a horizontal second side 306 for the guided tool 100. In other examples, the flattening shim 302 is shaped to provide a substantially planar surface that positions the cutting bit 112 at a substantially orthogonal angle to the surface of the component 110, as depicted in FIG. 3b. As used herein, the word "substantially" may refer to a measurement that is within about 10% of the stated value. For example, if an angle is substantially orthogonal then an acceptable range of angles includes about 80 degrees to about 100 degrees.

The flattening shim 302 may be formed of a polymer material by a rapid prototyping machine, such as a 3D printer. The shape and size of the flattening shim 302 may be derived from scanning the surface of the component 110. Additionally, the shape and size of the flattening shim may be derived from topographical information of an object stored in a computer-aided design file. The flattening shim 302, in one example, is 3D printed with a reversed surface configured to mate with the contour, or irregularity, of the component 110 surface.

The second side 306 of the flattening shim 302, as described above, is substantially planar to provide a flat surface over which the guided tool 100 may be moved. A groove or channel may be formed in the flattening shim 302 through which the cutting bit 112 travels. In other examples, the cutting bit 112 cuts a path through the polymer that forms the flattening shim 302.

Figure 4:
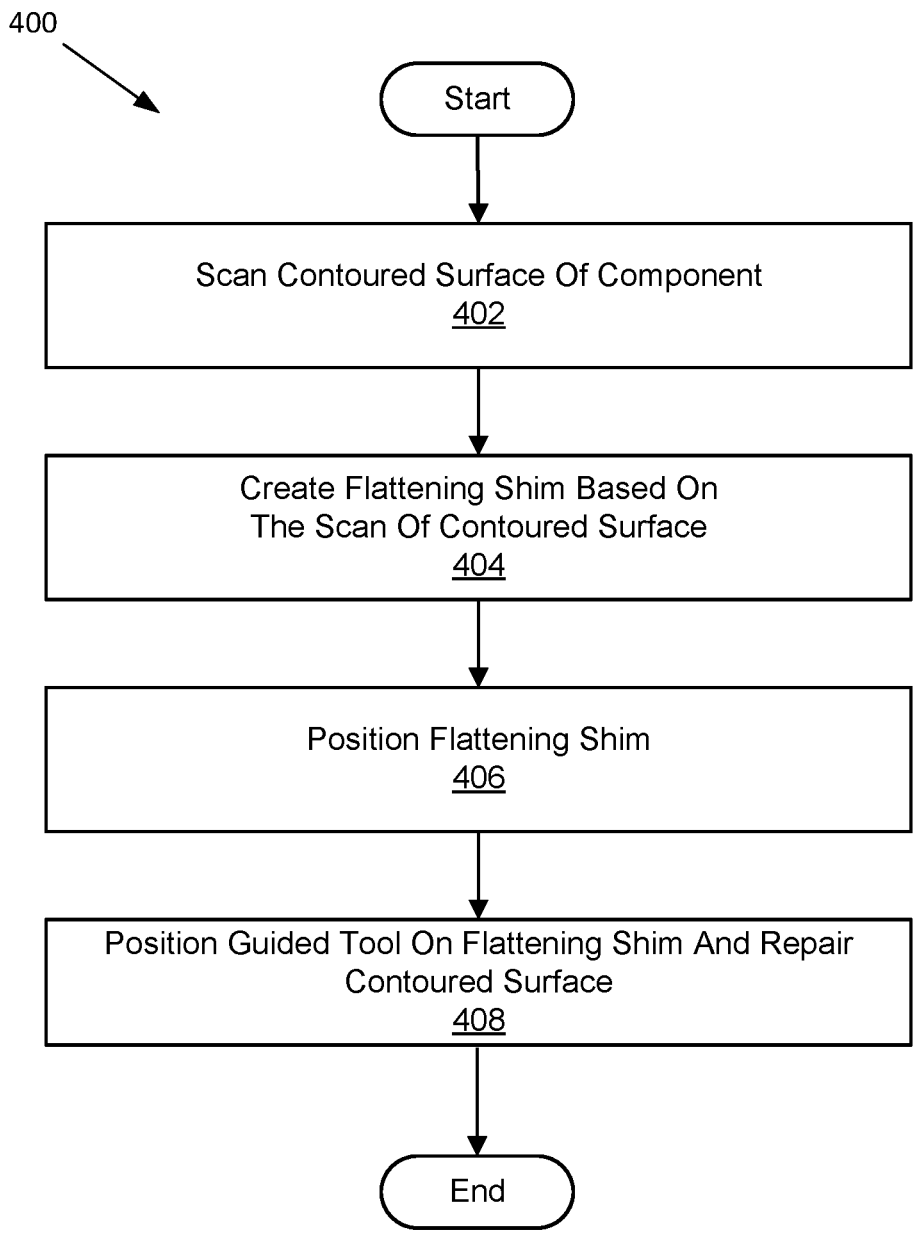
FIG. 4 is a schematic block diagram illustrating a method for guided tool repairs using a flattening shim in accordance with examples of the present disclosure.

FIG. 4 is a schematic block diagram illustrating a method 400 for guided tool repairs using a flattening shim 302 in accordance with examples of the disclosure. The method 400 includes, at step 402, scanning a contoured surface of a component 110. In certain examples, scanning a contoured surface includes scanning, with a hand-held laser scanner, for example, the surface to be repaired. In certain other examples, scanning a contoured surface may include analyzing topographical information of a 3D CAD design plan.

The method 400 includes, at step 404, creating a flattening shim 302 based on the scan of the contoured surface. In certain examples, creating a flattening shim 302 includes 3D printing a polymer member having at least a first side with a contour that mates with the contoured surface of the component 110. At least a second, substantially planar side is also created. The second side 306 is provided as a flat working surface for engaging the guided tool 100. At step 406, the method 400 includes positioning the flattening shim on the contoured surface to be repaired. In certain examples, the flattening shim 302 includes indexing members to correctly position the flattening shim 302. One example of an indexing member is a protrusion extending downward from the first side to engage an opening in the component 110.

At step 408, the method 400 includes positioning the guided tool, or guided tool 100, on the flattening shim 302 and repairing the contoured surface. One example of repairing the contoured surface includes the guided tool routing or hollowing out an area in a non-planar surface of the component in preparation for a repair. Examples of a hollowing out operation include drilling holes, and removing material in preparation for a scarf repair.

Figure 5:
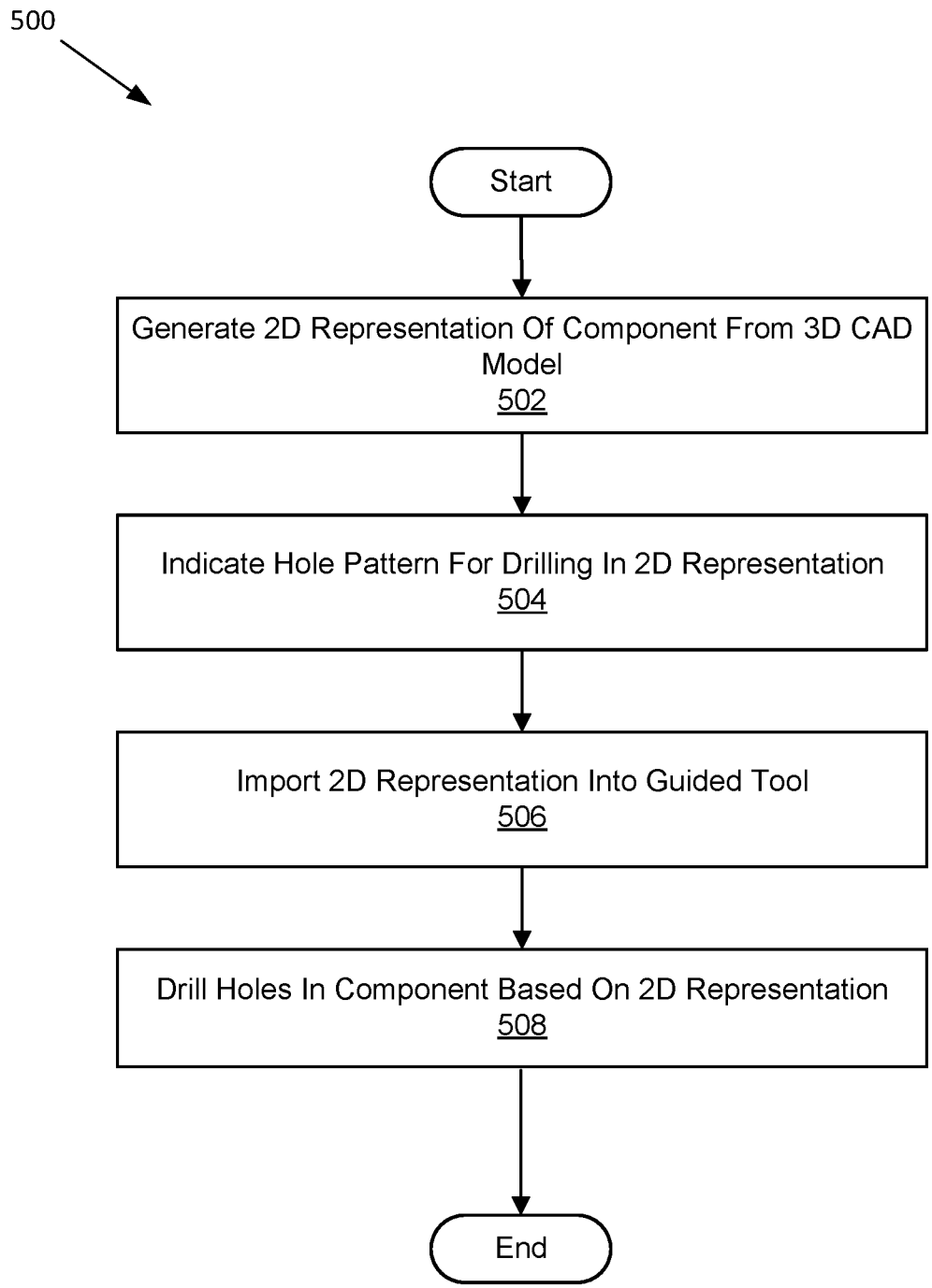
FIG. 5 is a schematic block diagram illustrating a method for generating a repair plan, in accordance with examples of the present disclosure.

FIG. 5 is a schematic block diagram illustrating a method 500 for generating a repair plan, in accordance with examples of the present disclosure. The method 500 includes, at step 502, generating a 2D representation of a component from a 3D CAD model of the component. In certain examples, generating a 2D representation of the component includes mapping the 3D CAD model on to a flattened surface. For example, a component repair plan may require a drilling pattern to replace rivets on the surface of an airplane wing. In this example, the method 500 includes transposing the hole layout from a 3D space to a 2D space. The method 500, at step 502, indicates in the 2D representation the locations of the rivet holes At step 506, the method 500 imports the 2D representation into the guided tool. For example, the 2D representation, including the hole pattern, is received by the controller 107 (see FIG. 2). The 2D representation is used by the controller 107 to precisely locate and drill holes, at step 508, in the component.

Figure 6:
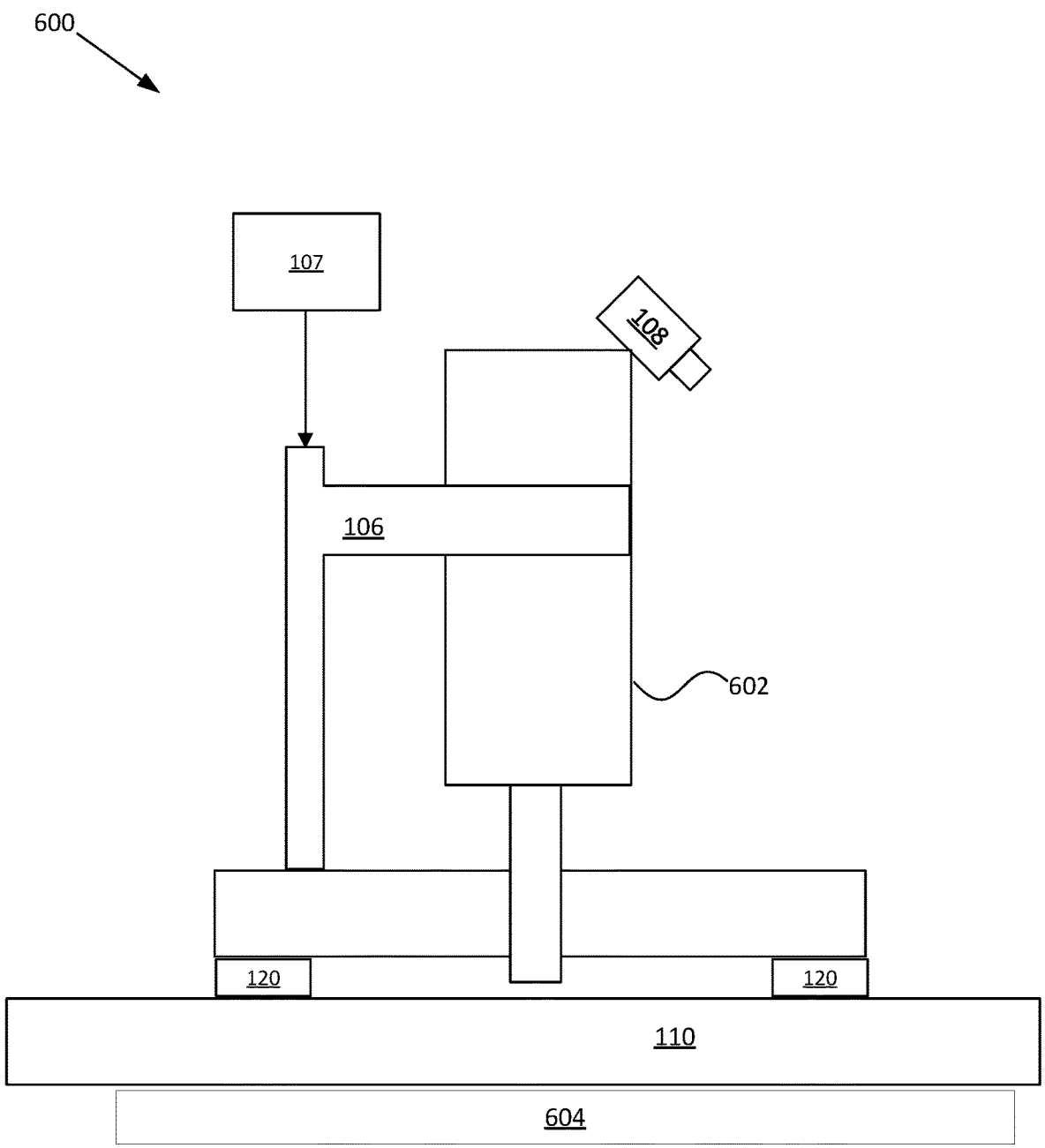
FIG. 6 is a schematic block diagram of a system having a non-destructive inspector, in accordance with examples of the present disclosure.

FIG. 6 is a schematic block diagram of a system 600 having a non-destructive inspector 602, in accordance with examples of the present disclosure. The system 600 is similar to the guided tool 100 of FIG. 1, in that the controller 107 is configured to adjust the position of the non-destructive inspector 602 via the moveable arm 106. The non-destructive inspector 602 may be a multi-sensor NDI ultrasonic probe to non-destructively determine if the component has suffered any type of damage. Transducers (not shown) are acoustically coupled to the component and moved incrementally along the surface of the component and produce ultrasonic waves which propagate into the component. Reflected waves are returned and detected by the non-destructive inspector 602 to provide data indicative of the presence of cracks, voids, delaminations etc. The data may be processed by the controller, or alternatively communicated with another processing unit for analysis. Beneficially, the controller 107 is configured to record an exact position of the detected damage and communicate the data indicative of damage along with positioning data. Previously, a technician would record a position of damage relative to the closest feature (e.g., hole, backside stringer/support beam, etc.) using rough measurements to those features. The controller 107 precisely records positioning information of the damage, which is useful in creating a repair plan.

In certain examples, a stiffened member 604, such as a beam, provides support for the component 110. For example, the component 110 may be a panel that forms an exterior surface of an aircraft and is coupled (i.e., riveted) to a framework formed from support beams. In certain situations, it is desirable to non-destructively inspect the stiffened member 604 under the component 110 without removing the component 110. However, a user guiding a conventional NDI tool may unintentionally guide the tool to an area that is between stiffened members 604. Beneficially, the system 600 is configured to adjust a position of the non-destructive inspector 602 with reference to the platform 102 to maintain the non-destructive inspector 602 over the support member 604.

Figure 7:
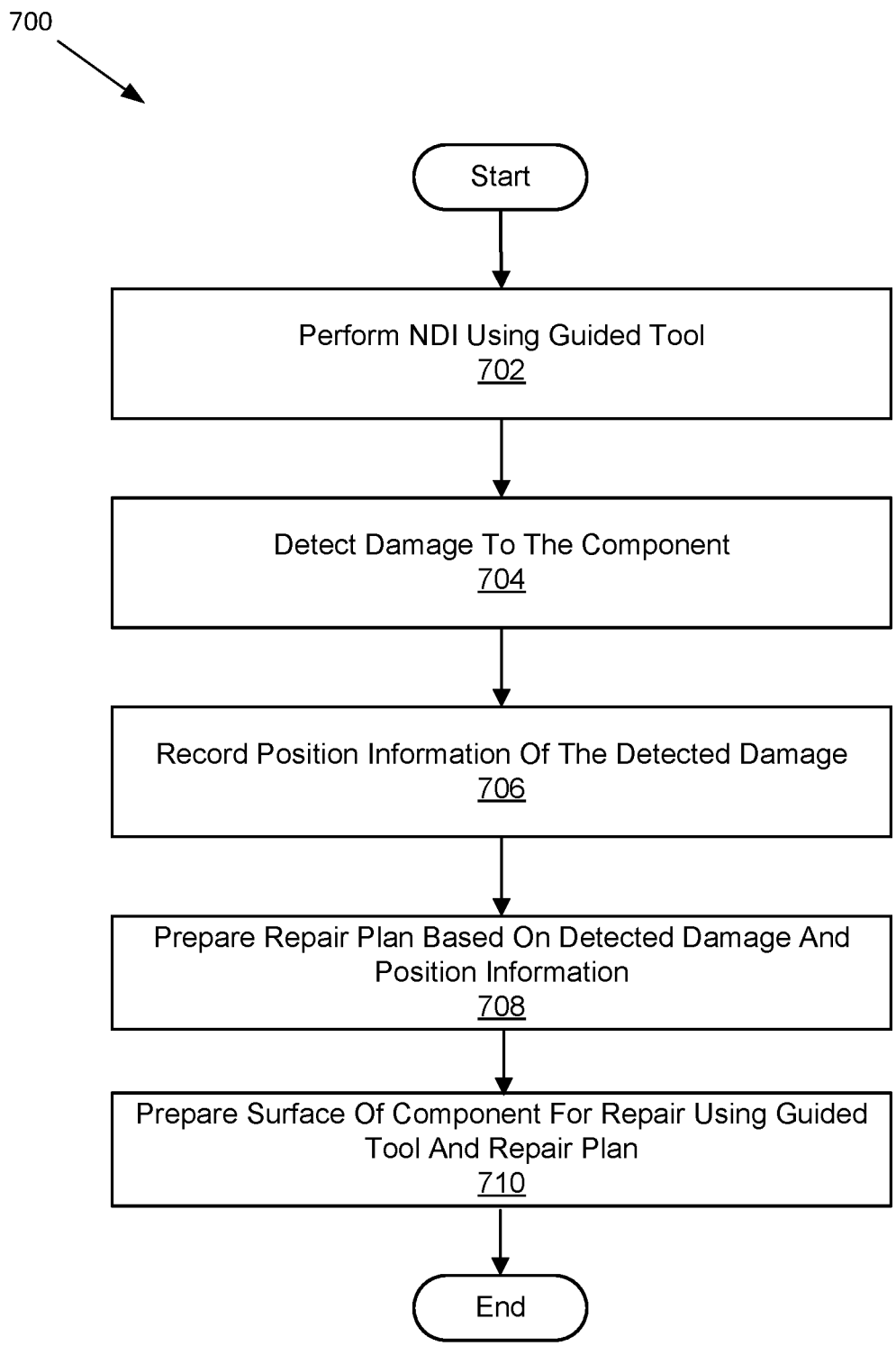
FIG. 7 is a schematic flowchart diagram illustrating a method for non-destructive inspection using a guided tool, in accordance with examples of the present disclosure.

FIG. 7 is a schematic flowchart diagram illustrating a method 700 for non-destructive inspection using a guided tool, in accordance with examples of the present disclosure. The method 700 includes, at step 702, performing a non-destructive inspection using a guided tool. The guided tool, in certain examples, is similar to the system 600 described above with reference to FIG. 6. In other words, the guided tool includes a platform 102, a controller 107, and a moveable arm 106 that is responsive to the controller 107. A non-destructive inspector is coupled to the moveable arm and is moveable with reference to the platform. As a user imprecisely guides the guided tool over the surface of a component, the controller adjusts the position of the non-destructive inspector with reference to the platform to maintain the non-destructive inspector precisely over a desired area of the component.

At step 704, the method 700 includes detecting damage to the component. As described above, the non-destructive inspector transmits ultrasonic waves into the component and analyzes the echo of the waves to identify damage. At step 706, the method 700 records the position information of the detected damage. The method 700, at step 708, includes preparing a repair plan based on the detected damage and the corresponding position information. The repair plan may include what type of surface preparation to perform (i.e., drill a hole, prepare for a scarf repair, etc.) and the corresponding location to perform the preparation. At step 710, the method 700 includes performing the repair preparation using the guided tool and the repair plan.

Figure 8:
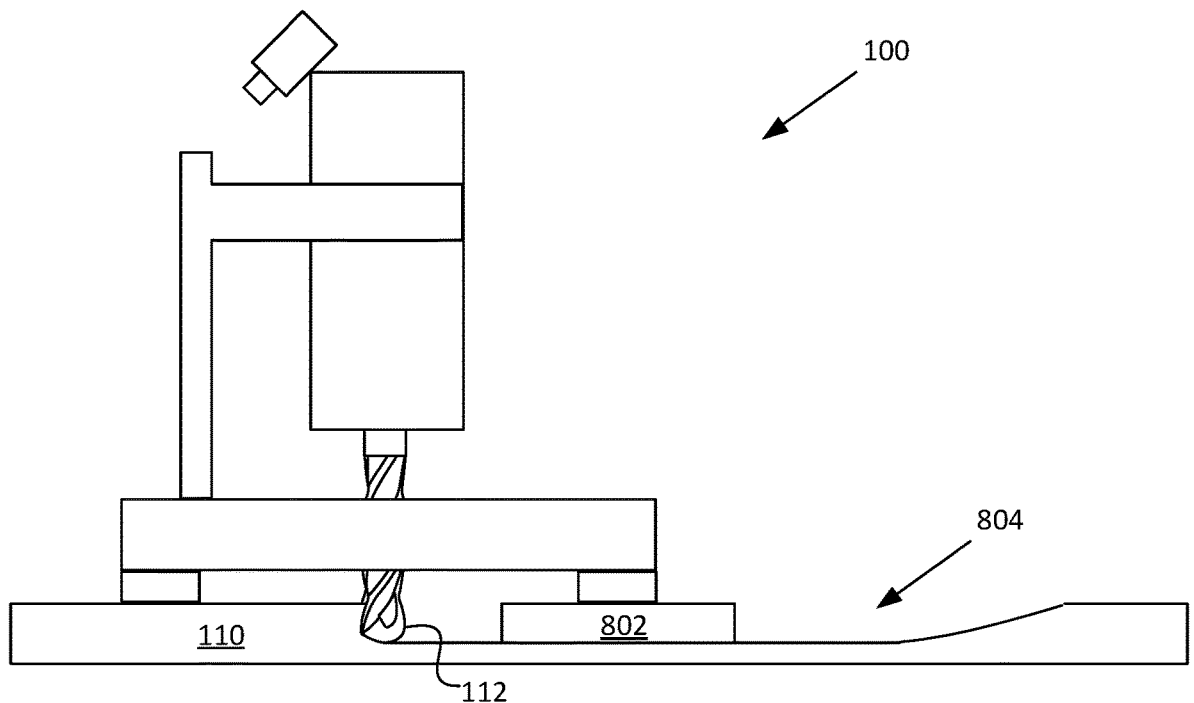
FIG. 8 is a schematic block diagram illustrating the guided tool performing a repair, in accordance with examples of the present disclosure.

FIG. 8 is a schematic block diagram illustrating the guided tool 100 performing a repair, in accordance with examples of the present disclosure. The guided tool 100 may be configured with a repair plan for performing what is known as a "scarf" repair. Scarf repairs may be tapered (as depicted in FIG. 8) or stepped. Scarf repairs are used for repairing composite structures and, briefly stated, generally involve a handheld router that grinds away a damaged portion of the composite structure into a circular shape. Next, a patch that matches the circular shape is placed within the routed area and adhered using adhesive.

In certain examples, the guided tool 100 is configured with a repair plan that may include removing material from the component 110 as part of a scarf repair. The controller (see FIGS. 1 and 2) is configured to control the position, including the plunge depth of the cutting bit 112, to precisely remove damaged material from the component 110. The circular depression or void 804 formed in the component 110 may be large and consequently, create an uneven surface for the guided tool 100. As the guided tool 100 removes material, a pre-made support surface plug 802 may be used to maintain the level of the guided tool 100. The plug 802, in certain examples, is 3D printed based on topographical information obtained from the repair plan and if available, a CAD plan of the component being repaired. In other words, the plug 802 is sized according to a depth of a cut that is going to be made by the guided tool 100, as defined in the repair plan.

Figure 9:
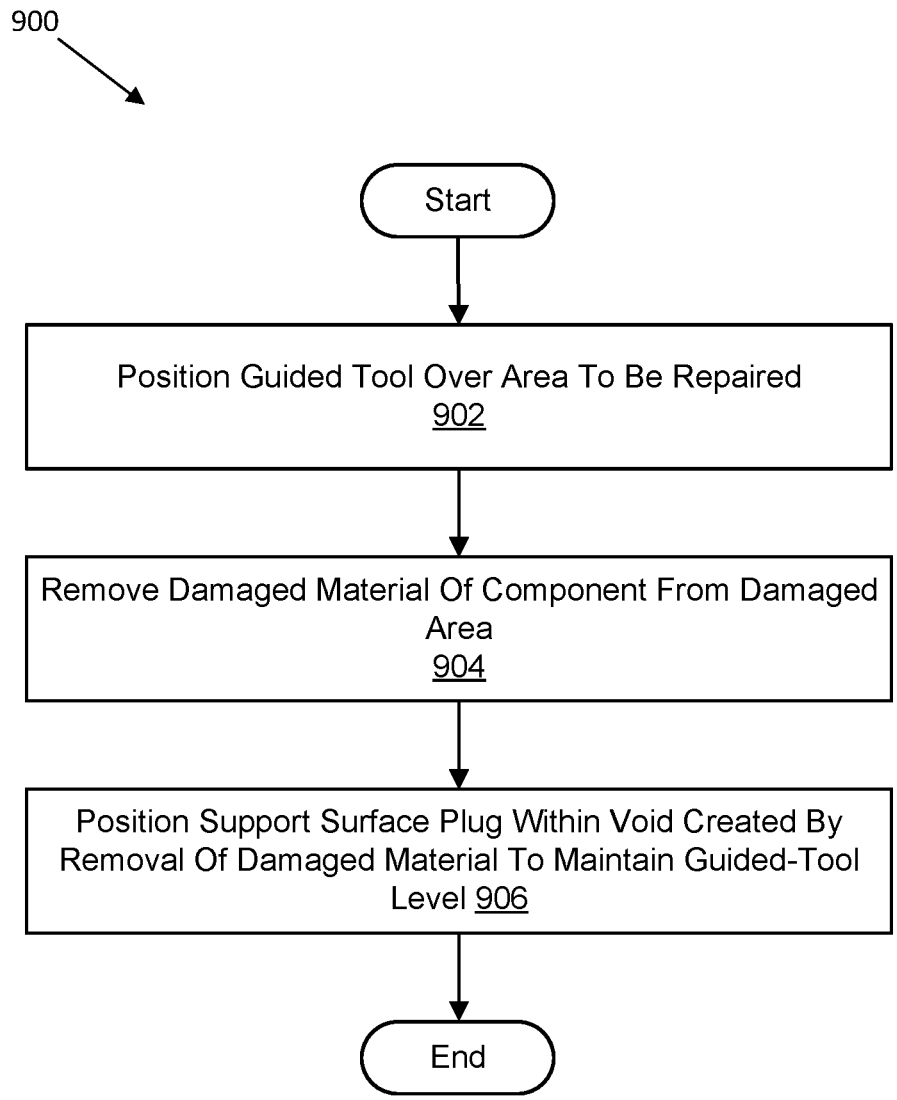
FIG. 9 is a schematic flowchart diagram illustrating a method of maintaining level of a guided tool during a repair, in accordance with examples of the present disclosure.

FIG. 9 is a schematic flowchart diagram illustrating a method 900 of maintaining level of a guided tool during a repair, in accordance with examples of the present disclosure. The method 900 includes, at step 902, positioning the guided tool 100, or guided tool, over an area of the component to be repaired. At step 904, the method 900 includes guiding the tool around the area and removing damaged material from the component based on a repair plan. The method 900 also includes, at step 906, intermittently inserting a plug within a void created by the removal of damaged material to maintain level of the guided tool.

Figure 10:
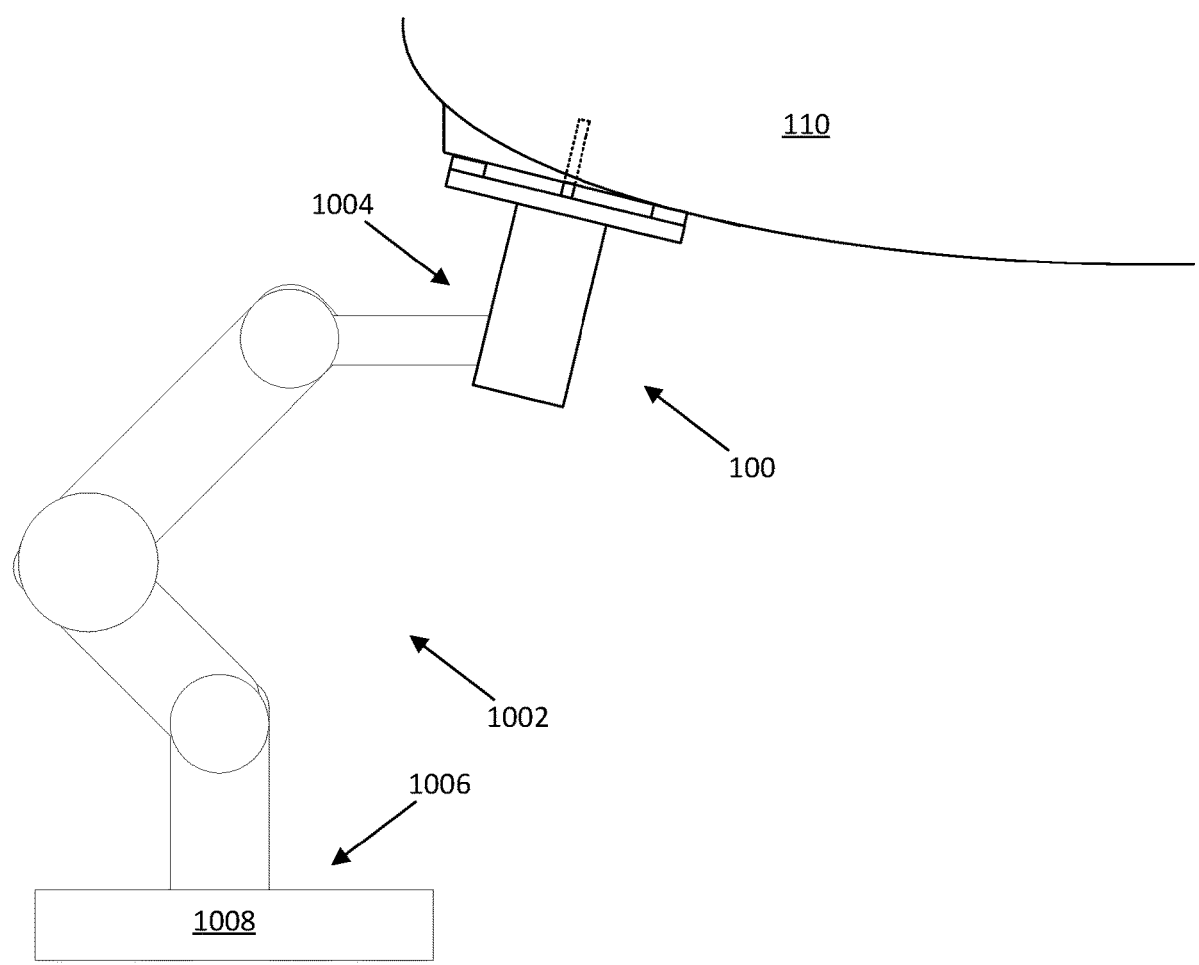
FIG. 10 is a schematic block diagram illustrating a zero-gravity arm for assisting in the guidance of the guided tool, in accordance with examples of the present disclosure.

FIG. 10 is a schematic block diagram illustrating a zero-gravity arm 1002 for assisting in the guidance of the guided tool 100, in accordance with examples of the present disclosure. The zero-gravity arm 1002, in certain examples, is a balance arm that offsets the weight of the guided tool 100 and lessens the burden on the user guiding the guided tool 100. The zero-gravity arm 1002 beneficially balances the weight of the guided tool 100, while maintaining the ability of the user to guide the guided tool 100. This greatly reduces the chances of injury, especially when operating the guided tool 100 on, for example, underside surfaces of the component 110. Beneficially, the zero-gravity arm 1002 enables operation of the guided tool 100 on non-horizontal surfaces. The zero-gravity arm 1002 is coupled at a first end 1004 to the guided tool 100, and at a second end 1006 to a support structure 1008. Examples of support structures include, but are not limited to, tables, scaffolding, poles, etc.

Figure 11:
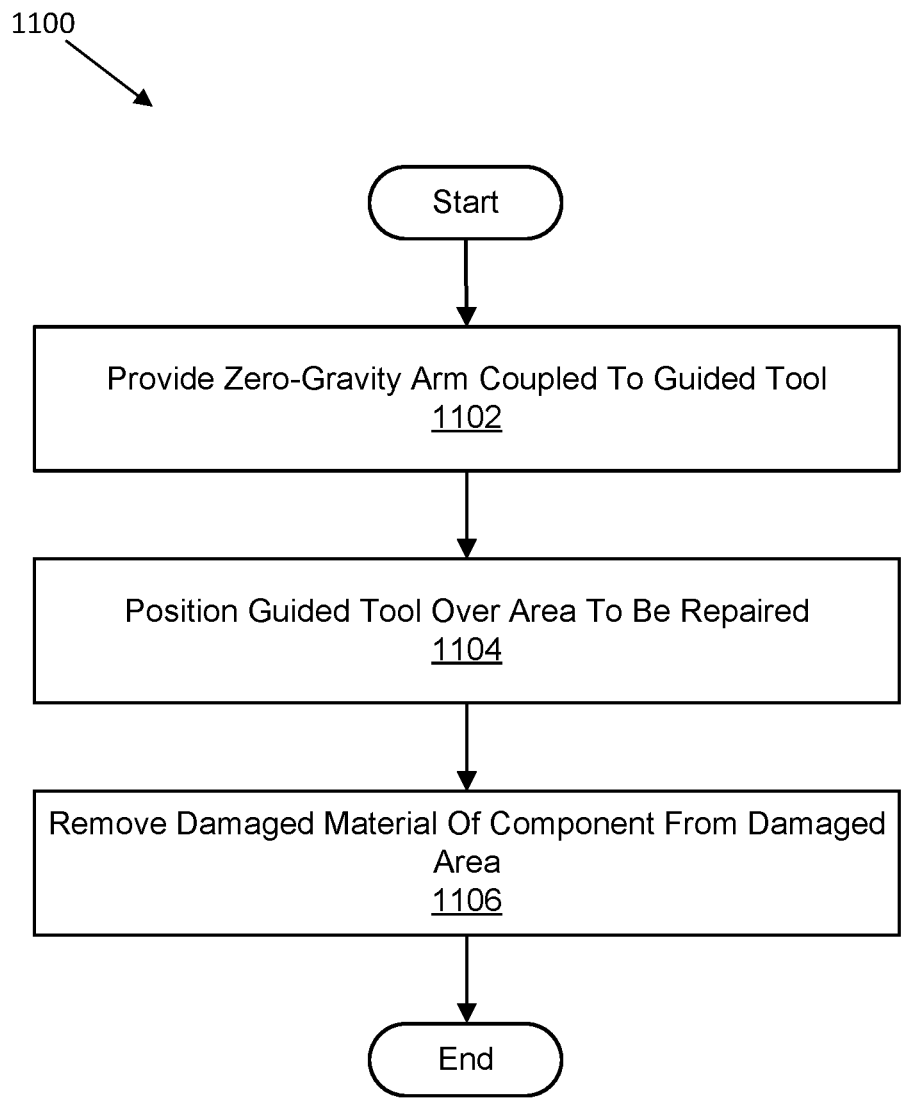
FIG. 11 is a schematic flowchart diagram illustrating a method of using a zero-gravity arm, in accordance with examples of the present disclosure.

FIG. 11 is a schematic flowchart diagram illustrating a method 1100 of using a zero-gravity arm, in accordance with examples of the present disclosure. The method 1100 includes, at step 1102, providing a zero-gravity arm coupled to a guided tool, such as the guided tool 100 of FIG. 1. The zero-gravity arm may be coupled at one end to a floor stand, or other structure, and at the other end to the guided tool. The zero-gravity arm applies a lifting force sufficient to offset the effects of gravity on the guided tool, thereby greatly simplifying the movement and positioning of the guided tool.

The method 1100 also includes, at step 1104, positioning the guided tool over an area of the component to be repaired. At step 1106, the method 1100 includes removing damaged material of the component from the damaged area.

Figure 12:
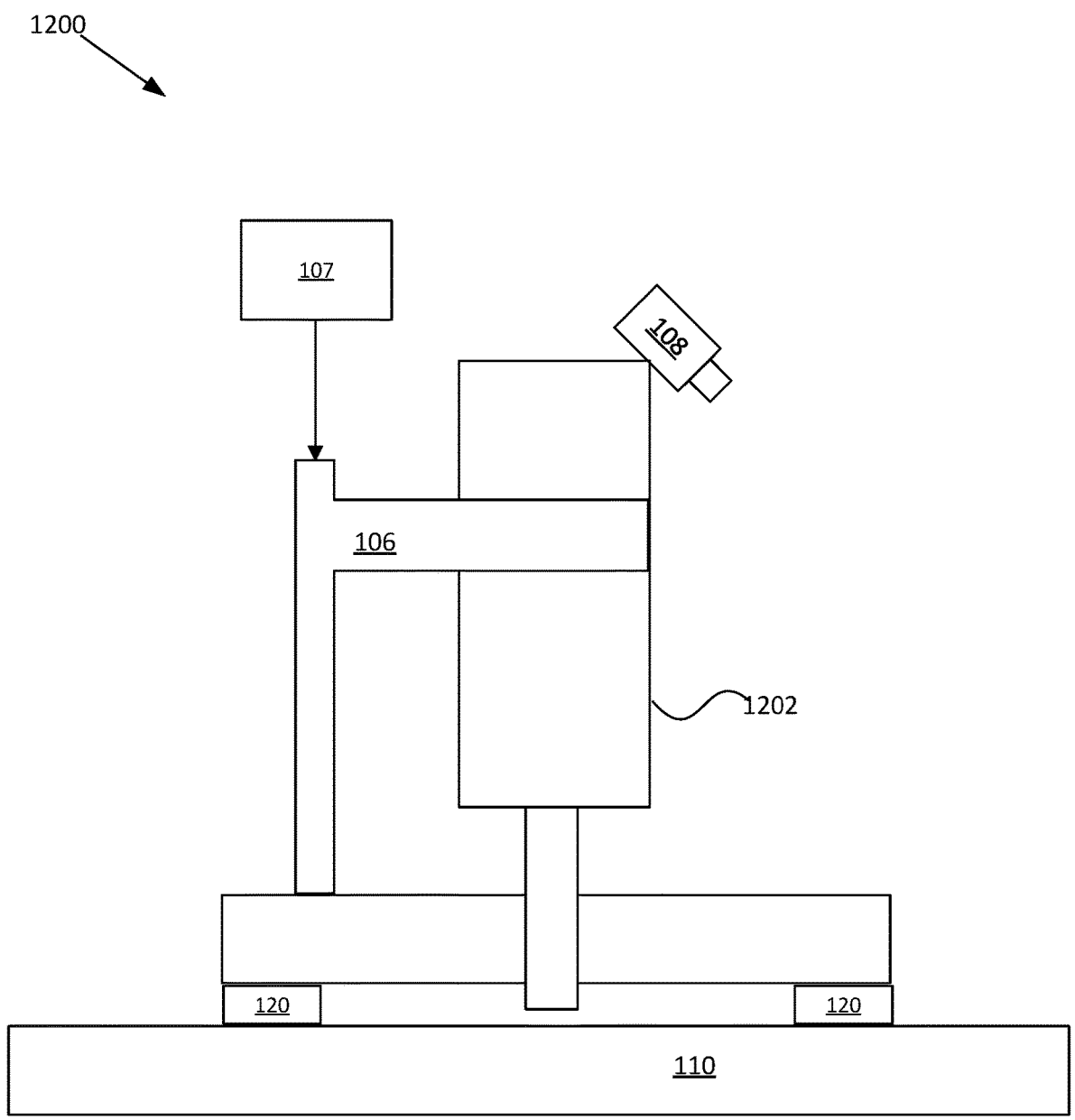
FIG. 12 is a schematic block diagram of a system having a plasma device, in accordance with examples of the present disclosure.

FIG. 12 is a schematic block diagram of a system 1200 having a plasma device 1202, in accordance with examples of the present disclosure. The system 1200 is similar to the guided tool 100 of FIG. 1, in that the controller 107 is configured to adjust the position of the plasma device 1202 via the moveable arm 106. The plasma device 1202 is useful to heat treat surfaces of the component 110. Coupling the plasma device 1202 to the system 1200 beneficially enables the precise positioning of the plasma device 1202 even when the system 1200 is guided imprecisely by a user. The plasma device 1202 may be used for surface preparation of the component 110, or in other words, to chemically activate the surface and to remove organic contaminates, such as in preparation for bonding.

Figure 13:
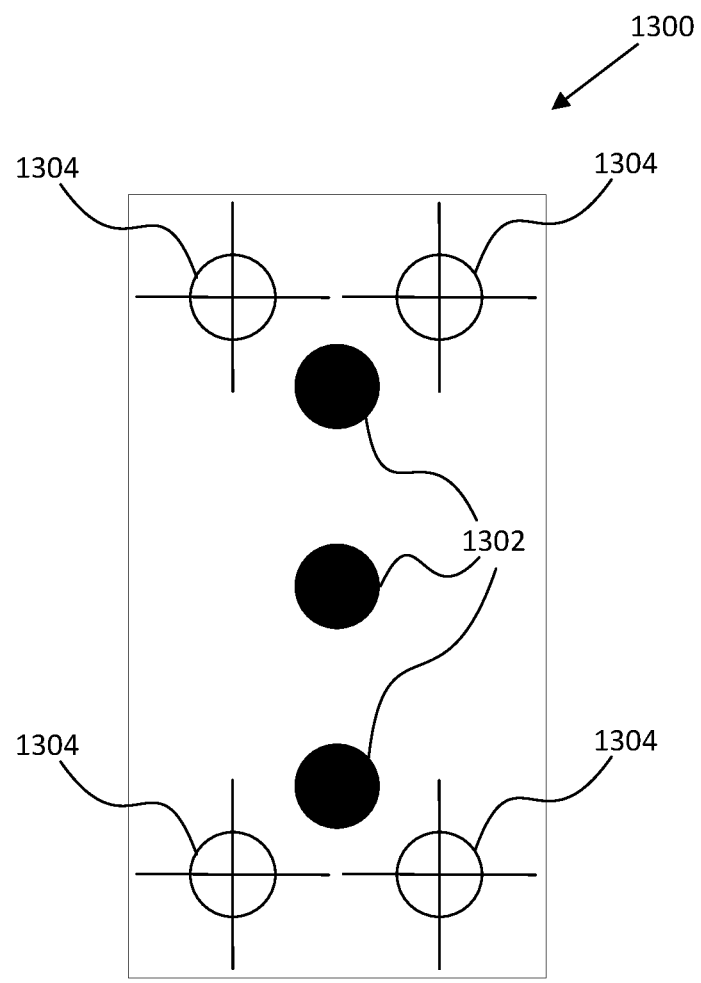
FIG. 13 is a schematic block diagram of a position encoder, in accordance with examples of the present disclosure.

FIG. 13 is a schematic block diagram of a position encoder 1300, in accordance with examples of the present disclosure. The position encoder 1300, in certain embodiments, is a drill-bar positioner having hole indicators 1302 of where holes are to be drilled in a component. The position encoder 1300 may also include position identifiers 1304. The position encoder 1300 may be a 3D printed device, or alternatively, an adhesive sticker that is attached to the surface of the component 110.

In the above description, certain terms may be used such as "up," "down," "upper," "lower," "horizontal," "vertical," "left," "right," "over," "under" and the like. These terms are used, where applicable, to provide some clarity of description when dealing with relative relationships. But, these terms are not intended to imply absolute relationships, positions, and/or orientations. For example, with respect to an object, an "upper" surface can become a "lower" surface simply by turning the object over. Nevertheless, it is still the same object. Further, the terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise. Further, the term "plurality" can be defined as "at least two."

Additionally, instances in this specification where one element is "coupled" to another element can include direct and indirect coupling. Direct coupling can be defined as one element coupled to and in some contact with another element. Indirect coupling can be defined as coupling between two elements not in direct contact with each other, but having one or more additional elements between the coupled elements. Further, as used herein, securing one element to another element can include direct securing and indirect securing. Additionally, as used herein, "adjacent" does not necessarily denote contact. For example, one element can be adjacent another element without being in contact with that element.

As used herein, the phrase "at least one of", when used with a list of items, means different combinations of one or more of the listed items may be used and only one of the items in the list may be needed. The item may be a particular object, thing, or category. In other words, "at least one of" means any combination of items or number of items may be used from the list, but not all of the items in the list may be required. For example, "at least one of item A, item B, and item C" may mean item A; item A and item B; item B; item A, item B, and item C; or item B and item C. In some cases, "at least one of item A, item B, and item C" may mean, for example, without limitation, two of item A, one of item B, and ten of item C; four of item B and seven of item C; or some other suitable combination.

Unless otherwise indicated, the terms "first," "second," etc. are used herein merely as labels, and are not intended to impose ordinal, positional, or hierarchical requirements on the items to which these terms refer. Moreover, reference to, e.g., a "second" item does not require or preclude the existence of, e.g., a "first" or lower-numbered item, and/or, e.g., a "third" or higher-numbered item.

As used herein, a system, apparatus, structure, article, element, component, or hardware "configured to" perform a specified function is indeed capable of performing the specified function without any alteration, rather than merely having potential to perform the specified function after further modification. In other words, the system, apparatus, structure, article, element, component, or hardware "configured to" perform a specified function is specifically selected, created, implemented, utilized, programmed, and/or designed for the purpose of performing the specified function. As used herein, "configured to" denotes existing characteristics of a system, apparatus, structure, article, element, component, or hardware which enable the system, apparatus, structure, article, element, component, or hardware to perform the specified function without further modification. For purposes of this disclosure, a system, apparatus, structure, article, element, component, or hardware described as being "configured to" perform a particular function may additionally or alternatively be described as being "adapted to" and/or as being "operative to" perform that function.

The schematic flow chart diagrams included herein are generally set forth as logical flow chart diagrams. As such, the depicted order and labeled steps are indicative of one example of the presented method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagrams, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

The present subject matter may be embodied in other specific forms without departing from its spirit or essential characteristics. The described examples are to be considered in all respects only as illustrative and not restrictive. All changes which come within the meaning and range of equivalency of the claims are to be embraced within their scope.

What is claimed is:

1. A method of repairing a component, the method comprising steps of:
    scanning a damaged area of the component, wherein scanning the damaged area includes scanning a non-planar surface of the component;
    preparing a repair plan in response to the scanning of the damaged area;
    positioning a flattening shim on the component, such that a non-planar surface of the flattening shim mates with the non-planar surface of the component, and a planar surface of the flattening shim is spaced from the non-planar surface of the component by a thickness of the flattening shim;
    providing the repair plan to a guided tool having a position correcting controller;
    passing a material-removal portion of the guided tool through the thickness of the flattening shim and into the component;
    moving the guided tool along, and in contact with, the planar surface of the flattening shim when the material-removal portion of the guided tool is passed through the thickness of the flattening shim and into the component;
    removing damaged material from the component, via the material-removal portion of the guided tool passing through the thickness of the flattening shim and into the component, in preparation for a repair operation; and
    positioning a support surface plug within a void created by the material-removal portion of the guided tool to maintain the guided tool at a desired level.

2. The method of claim 1, further comprising a step of making the flattening shim based on the scanning of the damaged area.

3. The method of claim 1, where the repair plan includes instructions for the position correcting controller to move a cutting tool, with reference to a platform, in three dimensions.

4. The method of claim 3, where the instructions cause the position correcting controller to adjust a cut depth in the component.

5. The method of claim 1, where the step of preparing the repair plan further comprises:
    generating a 2D representation of the component from a 3D computer-aided design (CAD) model;

indicating a drilling hole pattern in the 2D representation; and importing the 2D representation into the guided tool.

6. The method of claim 1, further comprising a step of operatively coupling a non-destructive inspector to the position correcting controller.

7. The method of claim 6, further comprising steps of:
performing non-destructive inspection by guiding the guided tool across the surface of the component;
detecting damage to the component;
recording position information of the detected damage; and
incorporating the position information in the repair plan.

8. The method of claim 1, further comprising steps of:
coupling a first end of a zero-gravity arm to the guided tool and a second end of the zero-gravity arm to a support structure; and
moving the guided tool relative to the support structure via the actuation of the zero-gravity arm.

9. The method of claim 1, further comprising a step of operatively coupling a plasma treatment device to the position correcting controller.

10. The method of claim 1, further comprising a step of using a drill-bar position encoder to indicate where holes are to be drilled in the component, where the drill-bar position encoder includes a plurality of hole indicators and a plurality of position identifiers.

11. A method of repairing a component, the method comprising steps of:
scanning a damaged area of the component;
preparing a repair plan in response to the scanning of the damaged area;
providing the repair plan to a guided tool having a position correcting controller;
passing a portion of the guided tool into the component;
moving the guided tool along the component;
removing damaged material from the component, via the material-removal portion of the guided tool; and
positioning a support surface plug within a void created by the material-removal portion of guided tool to maintain the guided tool at a desired level.

12. The method of claim 11, further comprising a step of making the support surface plug based on the repair plan.

13. The method of claim 11, where the support surface plug comprises a first surface configured to mate with a surface of the void and a second surface configured to mate with the guided tool.

14. The method of claim 11, wherein the material-removal portion of the guided tool comprises a non-destructive inspector, a plasma treatment device, or a cutting tool.

15. The method of claim 11, where the step of preparing the repair plan further comprises:
generating a 2D representation of the component from a 3D computer-aided design (CAD) model;
indicating a drilling hole pattern in the 2D representation; and
importing the 2D representation into the guided tool.

16. The method of claim 11, further comprising a step of operatively coupling a non-destructive inspector to the position correcting controller.

17. The method of claim 16, further comprising steps of:
performing non-destructive inspection by guiding the guided tool across the surface of the component;
detecting damage to the component;
recording position information of the detected damage; and
incorporating the position information in the repair plan.

18. The method of claim 11, where the repair plan includes instructions for the position correcting controller to move a cutting tool, with reference to a platform, in three dimensions.

19. The method of claim 18, where the instructions cause the position correcting controller to adjust a cut depth in the component.

20. The method of claim 11, further comprising steps of:
coupling a first end of a zero-gravity arm to the guided tool and a second end of the zero-gravity arm to a support structure; and
moving the guided tool relative to the support structure via the actuation of the zero-gravity arm.

* * * * *